(12) United States Patent
     Tsai et al.

(10) Patent No.: US 10,847,389 B2
(45) Date of Patent: *Nov. 24, 2020

(54) SYSTEMS AND METHODS FOR ANNEALING SEMICONDUCTOR STRUCTURES

(71) Applicant: Taiwan Semiconductor Manufacturing Company Limited, Hsinchu (TW)

(72) Inventors: Chun-Hsiung Tsai, Hsinchu County (TW); Zi-Wei Fang, Hsinchu (TW); Chao-Hsiung Wang, Hsinchu (TW)

(73) Assignee: TAIWAN SEMICONDUCTOR MANUFACTURING COMPANY LIMITED, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/658,312

(22) Filed: Oct. 21, 2019

(65) Prior Publication Data

US 2020/0051836 A1 Feb. 13, 2020

Related U.S. Application Data

(63) Continuation of application No. 16/048,847, filed on Jul. 30, 2018, now Pat. No. 10,453,716, which is a (Continued)

(51) Int. Cl.
    *H01L 21/67* (2006.01)
    *H01L 21/324* (2006.01)
    (Continued)

(52) U.S. Cl.
    CPC ...... *H01L 21/67115* (2013.01); *H01L 21/324* (2013.01); *H05B 6/6482* (2013.01);
    (Continued)

(58) Field of Classification Search
    None
    See application file for complete search history.

(56) References Cited

U.S. PATENT DOCUMENTS 5,707,466 A    1/1998  Atwater et al.
6,594,446 B2 * 7/2003  Camm ............... F27D 19/00
                                              392/416
(Continued)

FOREIGN PATENT DOCUMENTS

KR    20050008688    1/2005
KR    20060051930    5/2006
(Continued)

OTHER PUBLICATIONS

Doolittle, Alan, "Introduction to Semiconductors and Energy Bandgaps", ECE-4833, Georgia Tech University, http://alan.ece.gatech.edu/ECE4833/Lecture/Lecture3_Introduction2Semiconductors.pdf, publication date unknown, 91 pages.

(Continued)

*Primary Examiner* — Michelle Mandala
*Assistant Examiner* — Jordan M Klein
(74) *Attorney, Agent, or Firm* — Haynes and Boone, LLP

(57) ABSTRACT

Systems and methods are provided for annealing a semiconductor structure. In one embodiment, the method includes providing an energy-converting structure proximate a semiconductor structure, the energy-converting structure comprising a material having a loss tangent larger than that of the semiconductor structure; providing a heat reflecting structure between the semiconductor structure and the energy-converting structure; and providing microwave radiation to the energy-converting structure and the semiconductor structure. The semiconductor structure may include at least one material selected from the group consisting of boron-doped silicon germanium, silicon phosphide, titanium, nickel, silicon nitride, silicon dioxide, sili- (Continued)

con carbide, n-type doped silicon, and aluminum capped silicon carbide. The heat reflecting structure may include a material substantially transparent to microwave radiation and having substantial reflectivity with respect to infrared radiation.

20 Claims, 3 Drawing Sheets

Related U.S. Application Data continuation of application No. 15/639,055, filed on Jun. 30, 2017, now Pat. No. 10,037,906, which is a continuation of application No. 15/234,076, filed on Aug. 11, 2016, now Pat. No. 9,698,026, which is a continuation of application No. 14/819,536, filed on Aug. 6, 2015, now Pat. No. 9,418,871, which is a continuation of application No. 14/066,756, filed on Oct. 30, 2013, now Pat. No. 9,129,918.

(51) Int. Cl.
   *H05B 6/64* (2006.01)
   *H05B 6/80* (2006.01)
(52) U.S. Cl.
   CPC ............. *H05B 6/6491* (2013.01); *H05B 6/80* (2013.01); *H05B 6/806* (2013.01)

(56) References Cited

U.S. PATENT DOCUMENTS

| | | | |
|---|---|---|---|
| 6,941,063 B2 | 9/2005 | Camm et al. | |
| 7,183,229 B2* | 2/2007 | Yamanaka | C23C 16/24 |
| | | | 438/795 |
| 9,129,918 B2 | 9/2015 | Tsai et al. | |
| 9,418,871 B2 | 8/2016 | Tsai et al. | |
| 9,698,026 B2 | 7/2017 | Tsai et al. | |
| 10,453,716 B2* | 10/2019 | Tsai | H05B 6/6491 |
| 2001/0002948 A1* | 6/2001 | Aschner | C30B 25/12 |
| | | | 392/418 |
| 2001/0025841 A1* | 10/2001 | Pan | H01L 21/324 |
| | | | 219/390 |
| 2005/0023267 A1* | 2/2005 | Timans | F27B 17/0025 |
| | | | 219/405 |
| 2008/0207008 A1 | 8/2008 | Peelamedu et al. | |
| 2009/0184399 A1 | 7/2009 | Kowalski et al. | |
| 2009/0261366 A1 | 10/2009 | Eisert et al. | |
| 2010/0120263 A1 | 5/2010 | Hsueh et al. | |
| 2011/0143480 A1* | 6/2011 | Hilali | H01L 21/324 |
| | | | 438/58 |
| 2011/0233198 A1 | 9/2011 | Okuno et al. | |
| 2011/0315219 A1 | 12/2011 | Hasan et al. | |
| 2012/0196453 A1* | 8/2012 | Alford | H05B 6/6491 |
| | | | 438/795 |
| 2013/0023111 A1 | 1/2013 | Purtell | |
| 2013/0112670 A1* | 5/2013 | Yokogawa | H01J 37/32091 |
| | | | 219/121.36 |
| 2013/0266741 A1 | 10/2013 | Song et al. | |
| 2014/0038431 A1* | 2/2014 | Stowell | H01L 21/324 |
| | | | 438/795 |
| 2014/0073065 A1* | 3/2014 | Ohno | H01L 21/67248 |
| | | | 438/5 |
| 2015/0132930 A1 | 5/2015 | Watanabe et al. | |
| 2015/0255317 A1* | 9/2015 | Suguro | H01L 21/02532 |
| | | | 438/795 |
| 2015/0268543 A1 | 9/2015 | Wiener et al. | |
| 2016/0351414 A1 | 12/2016 | Tsai et al. | |
| 2017/0301572 A1 | 10/2017 | Tsai et al. | |
| 2018/0337077 A1 | 11/2018 | Tsai et al. | |

FOREIGN PATENT DOCUMENTS

| | | |
|---|---|---|
| KR | 20090113313 | 10/2009 |
| KR | 20130050866 | 5/2013 |
| TW | 200937531 | 9/2009 |
| WO | WO03089184 | 10/2003 |

OTHER PUBLICATIONS

Notice of Allowance for application 10-2014-0126624 dated Aug. 25, 2015, 3 pages.

* cited by examiner

SYSTEMS AND METHODS FOR ANNEALING SEMICONDUCTOR STRUCTURES

CROSS-REFERENCE TO RELATED APPLICATIONS

The present application is a continuation application of U.S. application Ser. No. 16/048,847, filed Jul. 30, 2018, which is a continuation application of U.S. application Ser. No. 15/639,055, filed Jun. 30, 2017, now U.S. Pat. No. 10,037,906, which is a continuation application of U.S. application Ser. No. 15/234,076, filed Aug. 11, 2016, now U.S. Pat. No. 9,698,026, which is a continuation application of U.S. application Ser. No. 14/819,536, filed Aug. 6, 2015, now U.S. Pat. No. 9,418,871, which is a continuation application of U.S. application Ser. No. 14/066,756, filed Oct. 30, 2013, now U.S. Pat. No. 9,129,918, each of which is hereby incorporated by reference in its entirety.

FIELD

The technology described in this patent document relates generally to semiconductor materials and more particularly to processing of semiconductor materials.

BACKGROUND

Modern semiconductor devices are often fabricated through many processes. For example, a semiconductor substrate for device fabrication may be doped (e.g., adding desired impurities into the substrate) to form junctions. Dopants introduced into the substrate are usually electrically activated before semiconductor devices can be fabricated on the substrate. The activation of the dopants often includes transferring the dopant atoms/molecules from interstitial positions into lattice sites of the lattice structure of the substrate. Different annealing techniques may be used for dopant activation, such as rapid thermal annealing (RTA), and laser annealing.

Under certain circumstances, the fabrication process of semiconductor devices involves microwave radiation which typically includes electromagnetic waves with wavelengths ranging from 1 m to 1 mm (corresponding to frequencies between 0.3 and 300 GHz). When microwave radiation is applied to a certain material (e.g., a dielectric material) which includes electric dipoles, the dipoles change their orientations in response to the changing electric fields of the microwave radiation and thus the material may absorb the microwave radiation to generate heat. The response of the material to the electric field of the microwave radiation can be measured using a complex permittivity, $\varepsilon(\omega)^*$, which depends on the frequency of the electric field:

$$\varepsilon(\omega)^* = \varepsilon(\omega)' i\varepsilon(\omega)'' = \varepsilon_0(\varepsilon_r(\omega)' i\varepsilon_r(\omega)'') \qquad (1)$$

where $\omega$ represents the frequency of the electric field, $\varepsilon(\omega)'$ represents a real component of the complex permittivity (i.e., a dielectric constant), and $\varepsilon(\omega)''$ represents a dielectric loss factor. In addition, $\varepsilon_0$ represents the permittivity of a vacuum, $\varepsilon_r(\omega)'$ represents the relative dielectric constant, and $\varepsilon_r(\omega)''$ represents the relative dielectric loss factor.

Whether a material can absorb the microwave radiation can be characterized using a loss tangent, $\tan \delta$:

$$\tan \delta = \frac{\varepsilon'' \mu' - \varepsilon' \mu''}{\varepsilon' \mu' + \varepsilon'' \mu''} \qquad (2)$$

where $\mu'$ represents a real component of the magnetic permeability of the material, and $\mu''$ represents a magnetic loss factor. Assuming negligible magnetic loss (i.e., $\mu''=0$), the loss tangent of a material is expressed as follows:

$$\tan \delta = \frac{\varepsilon''}{\varepsilon'} = \frac{\varepsilon_r''}{\varepsilon_r'} \qquad (3)$$

Materials with a low loss tangent (e.g., $\tan \delta < 0.01$) allow microwaves to pass through with very little absorption. Materials with an extremely high loss tangent (e.g., $\tan \delta > 10$) reflect microwaves with little absorption. Materials with an intermediate loss tangent (e.g., $10 \geq \tan \delta \geq 0.01$) can absorb microwave radiation.

SUMMARY

In accordance with the teachings described herein, systems and methods are provided for annealing a semiconductor structure. For example, a semiconductor structure is provided. An energy-converting structure capable of increasing the semiconductor structure's absorption of microwave radiation is provided. A heat reflecting structure is provided between the energy-converting structure and the semiconductor structure, the heat reflecting structure being capable of reflecting thermal radiation from the semiconductor structure. Microwave radiation is applied to the energy-converting structure and the semiconductor structure to anneal the semiconductor structure for fabricating semiconductor devices.

In one embodiment, a system for annealing a semiconductor structure includes an energy-converting structure, a heat reflecting structure, and a microwave-radiation source. The energy-converting structure is configured to increase a semiconductor structure's absorption of microwave radiation. The heat reflecting structure is configured to reflect thermal radiation from the semiconductor structure, the heat reflecting structure being disposed between the energy-converting structure and the semiconductor structure. The microwave-radiation source is configured to apply microwave radiation to the energy-converting structure and the semiconductor structure to anneal the semiconductor structure for fabricating semiconductor devices.

DETAILED DESCRIPTION

The conventional annealing technologies often have some disadvantages. For example, a substrate used for device fabrication often includes various device patterns (e.g., through deposition, lithography and/or etching). These different patterns usually correspond to different thicknesses and material types which result in different heat emissivity. During an annealing process (e.g., RTA), different regions on the substrate often absorb and emit different amounts of heat, which results in localized temperature non-uniformity on the substrate. Furthermore, photons of light sources (e.g., lamps used for RTA or lasers used for laser annealing) may not penetrate beyond surface regions of the substrate, which often causes uneven heating of the substrate at different depths.

Figure 1:
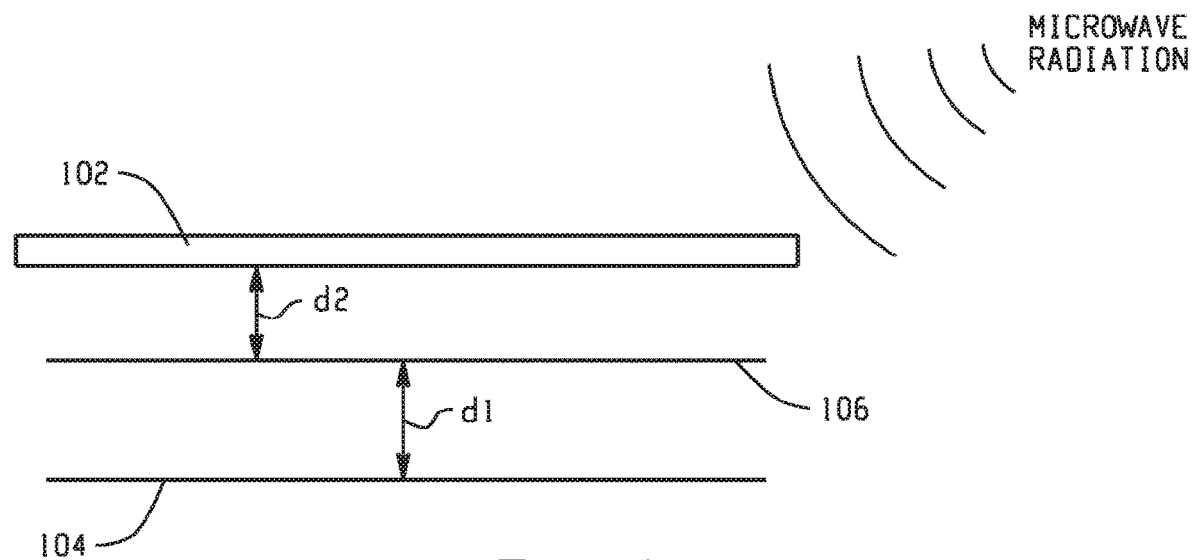
FIG. 1 depicts an example diagram for annealing a semiconductor structure using microwave radiation.

FIG. 1 depicts an example diagram for annealing a semiconductor structure using microwave radiation. As shown in FIG. 1, microwave radiation is applied to an energy-converting structure (e.g., made of energy converting material) 102 and a semiconductor structure 104 to anneal the semiconductor structure 104 (e.g., for dopant activation). A heat reflecting structure 106 is disposed between the energy-converting structure 102 and the semiconductor structure 104 to reflect thermal radiation back to the semiconductor structure 104 during the annealing process. Microwave radiation penetrates deeply into the semiconductor structure 104 and results in volumetric heating of the semiconductor structure 104.

Specifically, the semiconductor structure 104 which has a small loss tangent may not absorb microwave radiation efficiently. The energy-converting structure 102 which has a large loss tangent (e.g., in a range of about 0.01 to about 2) absorbs microwave radiation more efficiently, and in response a temperature associated with the energy-converting structure 102 increases rapidly. On one hand, the heat generated by the energy-converting structure 102 may increase the temperature of the semiconductor structure 104 (e.g., through conduction or radiation). At the elevated temperature, the interaction between the semiconductor structure 104 and the microwave radiation increases. On the other hand, the energy-converting structure 102 increases an electric field density over the semiconductor structure 104 (e.g., the temperature of the semiconductor structure 104 being raised to 400° C.-700° C.). For example, at the raised electric field density, the electric field reacts with defects within the semiconductor structure 104 through interfacial polarization so as to further activate the dopants.

During the annealing process, the semiconductor structure 104 emits thermal radiation (e.g., infrared radiation). The heated heat reflecting structure 106 reflects such thermal radiation back to the semiconductor structure 104 so that the thermal radiation generated by the semiconductor structure 104 is conserved between the heat reflecting structure 106 and the semiconductor structure 104 (e.g., to reduce localized temperature non-uniformity). The distance (e.g., d1) between the heat reflecting structure 106 and the semiconductor structure 104 may be adjusted to ensure that most thermal radiation from the semiconductor structure 104 is reflected back. In certain embodiments, the heat reflecting structure 106 is placed on top of device patterns formed on the semiconductor structure 104. For example, the heat reflecting structure 106 is approximately transparent to the microwave radiation, and is opaque to the thermal radiation (e.g., infrared radiation). As an example, the heat reflecting structure 106 has a reflectivity larger than 95% with respect to infrared radiation. In some embodiments, the heat reflecting structure 106 includes a semiconductor wafer (e.g., a blank silicon wafer) that contains dopants to provide additional free carriers. In certain embodiments, the heat reflecting structure 106 includes a semiconductor wafer (e.g., a blank silicon wafer) that does not contain dopants.

For example, the semiconductor structure 104 includes a junction with a number of dopants formed on a substrate at an elevated temperature (e.g., in a range of about 300° C. to about 600° C.) by epitaxial growth. The microwave radiation is applied to anneal the semiconductor structure 104 for dopant activation. The energy-converting structure 102 intensifies the electric field density over the semiconductor structure 104. The semiconductor structure 104 absorbs more microwave radiation under the increased electric field density. More and more reactions between the electric field and defects in the semiconductor structure 104 occur through interfacial polarization. For example, positive charges and/or negative charges accumulated at boundaries of the defects may cause the defects to dissolve eventually for further dopant activation. Once the electric field density over the semiconductor structure 104 exceeds a threshold, the interfacial polarization eventually breaks the bonds between the dopants and the interstitial sites in the semiconductor structure 104, so that the dopants are activated. The distance (e.g., d2) between the energy-converting structure 102 and the semiconductor structure 104 may be adjusted to improve the dopant activation. For example, the dopants include phosphorous, phosphorous-based molecules, germanium, helium, boron, boron-based molecules, or other materials.

In some embodiments, the microwave radiation applied to the energy-converting structure 102 has a frequency in the range of about 2 GHz to about 10 GHz. For example, the energy-converting structure 102 includes boron-doped silicon germanium, silicon phosphide, titanium, nickel, silicon nitride, silicon dioxide, silicon carbide, n-type doped silicon, aluminum cap silicon carbide, or other materials. The energy-converting structure 102 may have a larger size than the semiconductor structure 104 so that the electric field density may be approximately uniform over the semiconductor structure 104. In certain embodiments, the temperature of the semiconductor structure 104 is kept within a range of about 300° C. to about 600° C. to reduce dopant diffusion. For example, the microwave radiation is applied to the energy-converting structure 102 and the semiconductor structure 104 for a time period within a range of about 40 seconds to about 300 seconds.

Figure 2:
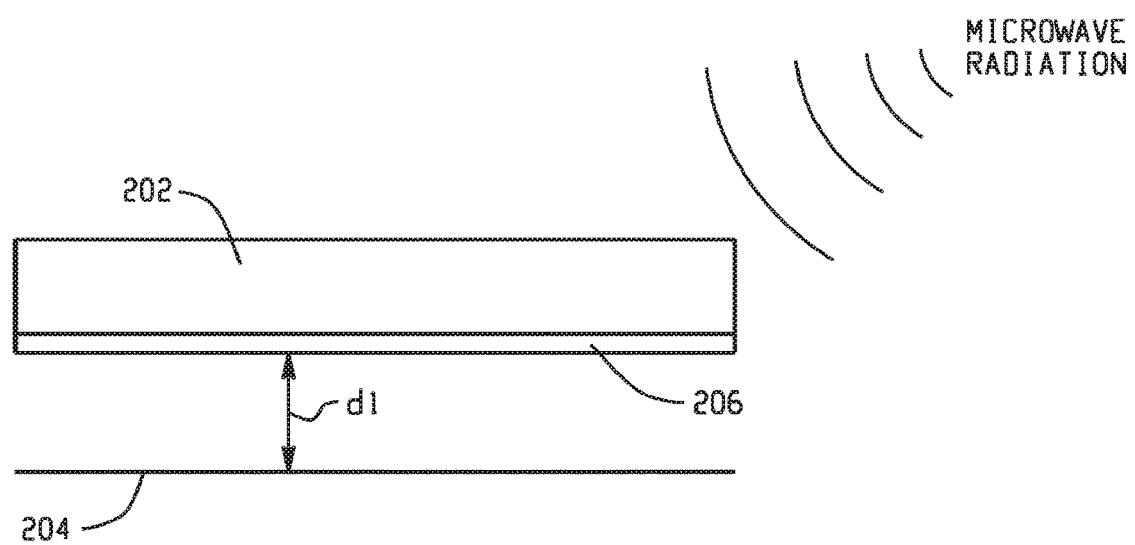
FIG. 2 depicts another example diagram for annealing a semiconductor structure using microwave radiation.

FIG. 2 depicts another example diagram for annealing a semiconductor structure using microwave radiation. As shown in FIG. 2, microwave radiation is applied to an energy-converting structure 202 and a semiconductor structure 204 to anneal the semiconductor structure 204 (e.g., for dopant activation). A heat reflecting structure 206 is formed on the energy-converting structure 202 and is disposed on top of the semiconductor structure 204 to reflect thermal radiation back to the semiconductor structure 204 during the annealing process. For example, the heat reflecting structure 206 is formed on the energy-converting structure 202 through epitaxial growth, (e.g., deposition). As an example, the energy-converting structure 202 is capable of generating the thermal radiation in response to the applied microwave radiation and increasing an electric field density over the semiconductor structure 204.

During the annealing process, the heat reflecting structure 206 reflects thermal radiation emitted by the semiconductor structure 204 back to the semiconductor structure 204 so that such thermal radiation is conserved between the heat reflecting structure 206 and the semiconductor structure 204 (e.g., to reduce localized temperature non-uniformity). For example, the heat reflecting structure 206 (e.g., a blank silicon wafer) is approximately transparent to the microwave radiation and opaque to the thermal radiation (e.g., infrared radiation).

Figure 3:
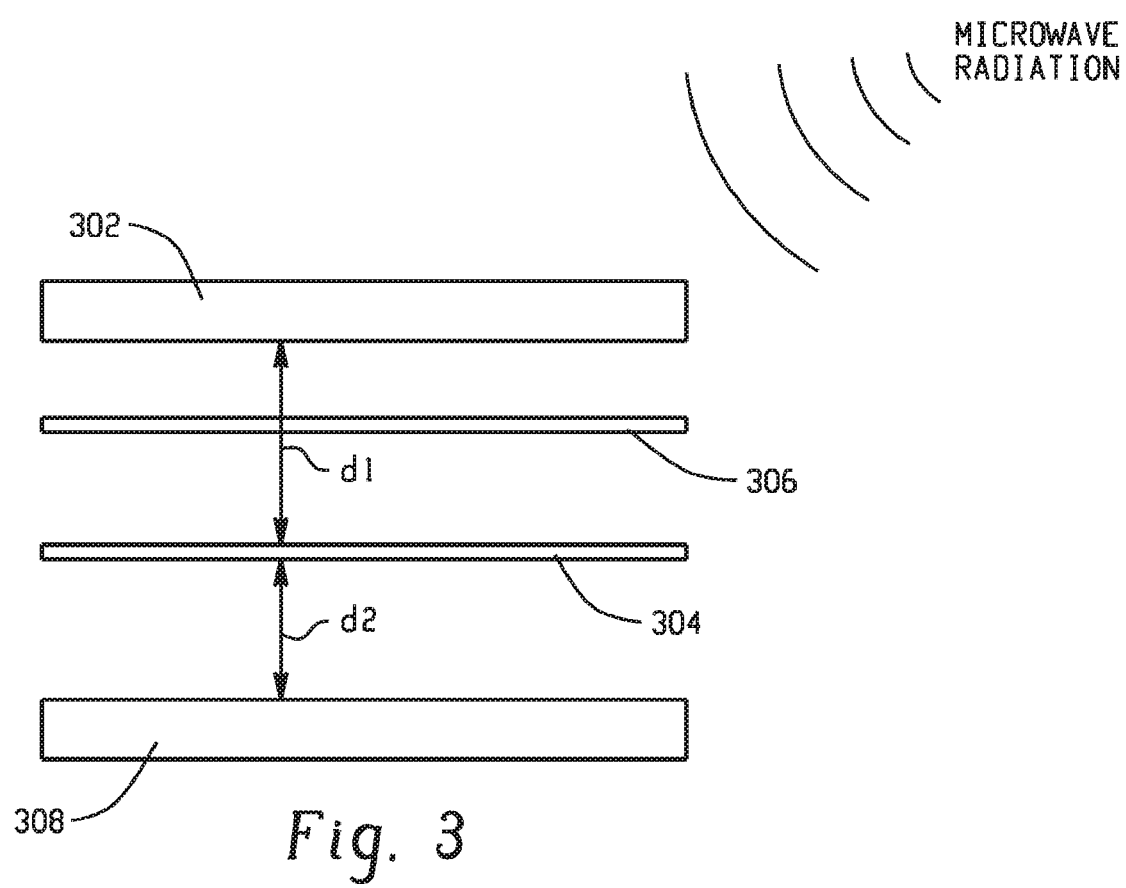
FIG. 3 depicts yet another example diagram for annealing a semiconductor structure using microwave radiation.

FIG. 3 depicts yet another example diagram for annealing a semiconductor structure using microwave radiation. As shown in FIG. 3, microwave radiation is applied to two energy-converting structures 302 and 308 and a semiconductor structure 304 to anneal the semiconductor structure 304 (e.g., for dopant activation). A heat reflecting structure 306 is disposed between the energy-converting structure 302 and the semiconductor structure 304 to reflect thermal radiation back to the semiconductor structure 304 during the annealing process.

Figure 4:
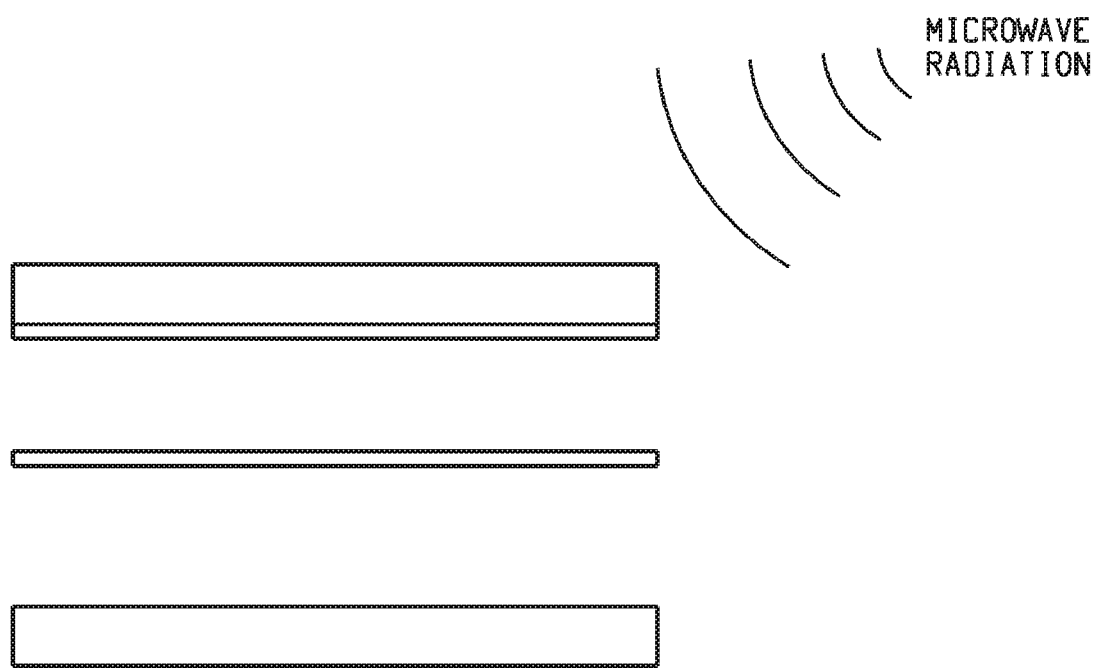
FIG. 4 depicts another example diagram for annealing a semiconductor structure using microwave radiation.

For example, the energy-converting structures 302 and 308 have a same loss tangent or different loss tangents. As an example, the distance (e.g., d1) between the energy-converting structure 302 and the semiconductor structure 304 is the same as or different from the distance (e.g., d2) between the energy-converting structure 308 and the semiconductor structure 304. In some embodiments, the heat reflecting structure 306 is formed on the energy-converting structure 302 through epitaxial growth, (e.g., deposition), as shown in FIG. 4.

Figure 5:
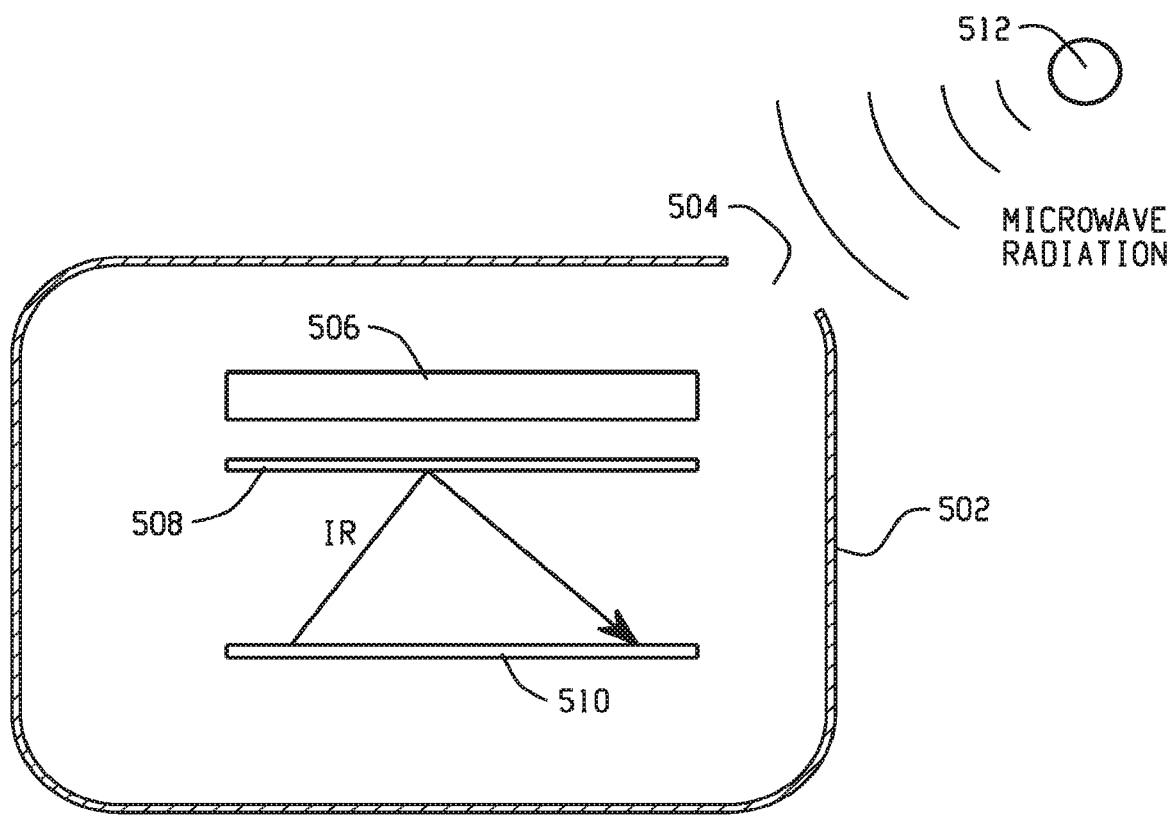
FIG. 5 depicts an example diagram showing a system for annealing a semiconductor structure using microwave radiation.

FIG. 5 depicts an example diagram showing a system for annealing a semiconductor structure using microwave radiation. As shown in FIG. 5, a shell 502 includes a microwave port 504 through which microwave radiation may be introduced into the shell 502. During the annealing process, microwave radiation generated by a microwave-radiation source 512 is applied to an energy-converting structure 506 and a semiconductor structure 510 to anneal the semiconductor structure 510 (e.g., for dopant activation). A heat reflecting structure 508 is disposed between the energy-converting structure 506 and the semiconductor structure 510 to reflect thermal radiation back to the semiconductor structure 510. For example, the shell 502 is made of a metal material. As an example, the energy-converting structure 506 is pre-heated to a predetermined temperature (e.g., in a range of about 300° C. to about 600° C.) by a heat source (e.g., an Ar lamp, a Xeon lamp, or a tungsten-halogen lamp).

In some embodiments, an additional energy-converting structure is placed in the shell 502 so that the semiconductor structure 510 is disposed between the heat reflecting structure 508 and the additional energy-converting structure. In certain embodiments, the heat reflecting structure 508 is formed on the energy-converting structure 506 through epitaxial growth.

Figure 6:
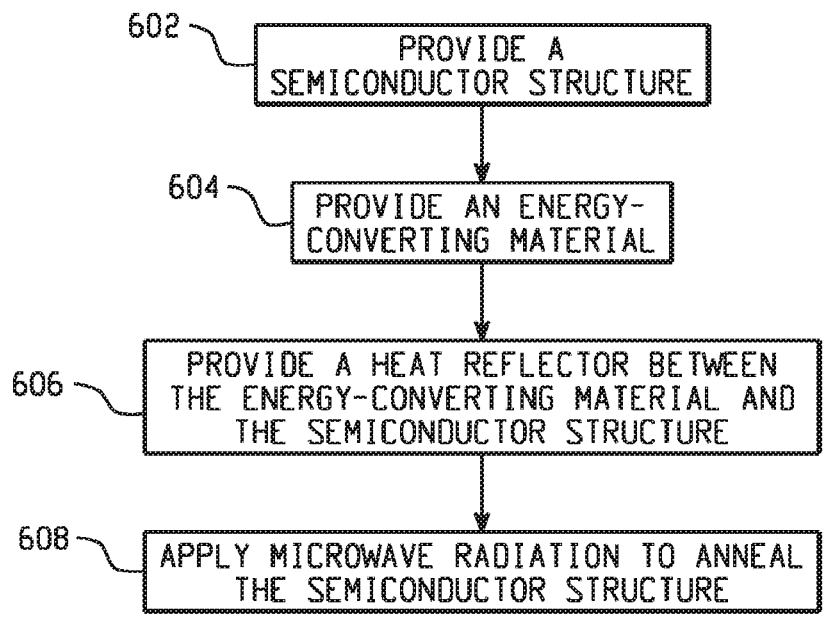
FIG. 6 depicts an example diagram showing a flow chart for annealing a semiconductor structure using microwave radiation.

FIG. 6 depicts an example diagram showing a flow chart for annealing a semiconductor structure using microwave radiation. At 602, a semiconductor structure is provided. For example, the semiconductor structure includes a plurality of dopants. At 604, an energy-converting structure capable of increasing the semiconductor structure's absorption of microwave radiation is provided. For example, the energy-converting structure is capable of increasing an electric field density associated with the semiconductor structure. As an example, the energy-converting structure includes boron-doped silicon germanium, silicon phosphide, titanium, nickel, silicon nitride, silicon dioxide, silicon carbide, or other materials.

At 606, a heat reflecting structure is disposed between the energy-converting structure and the semiconductor structure. The heat reflecting structure is capable of reflecting thermal radiation from the semiconductor structure. For example, the heat reflecting structure includes a blank silicon wafer. The thermal radiation includes infrared radiation. In some embodiments, the heat reflecting structure has a reflectivity larger than 95% with respect to infrared radiation, and is approximately transparent to the microwave radiation.

At 608, microwave radiation is applied to the energy-converting structure and the semiconductor structure to anneal the semiconductor structure (e.g., for dopant activation). For example, the energy-converting structure increases the electric field density in response to the microwave radiation so as to affect dipoles formed in the semiconductor structure and motions of the formed dipoles. The formed dipoles are related to dopants in the semiconductor structure. As an example, the semiconductor structure's absorption of microwave radiation is increased in response to the increased electric field density so as to dissolve certain dopant clusters included in the semiconductor structure.

Accordingly, one aspect of the instant disclosure provides a method that comprises: providing an energy-converting structure proximate a semiconductor structure, the energy-converting structure comprising a material having a loss tangent larger than that of the semiconductor structure; providing a heat reflecting structure between the semiconductor structure and the energy-converting structure; and providing microwave radiation to the energy-converting structure and the semiconductor structure.

Accordingly, another aspect of the instant disclosure provides a system for annealing a semiconductor structure, the system comprises: a first energy-converting structure arranged proximate the semiconductor structure to be annealed, comprising a material having a loss tangent larger than that of the semiconductor structure; a heat reflecting structure arranged between the semiconductor structure and the first energy-converting structure; and a microwave source for generating microwave radiation to anneal the semiconductor structure.

Accordingly, yet another aspect of the instant disclosure provides a method of annealing a semiconductor structure using a microwave system, the method comprises: arranging an energy-converting structure proximate the semiconductor structure, the semiconductor structure comprising at least one material selected from the group consisting of boron-doped silicon germanium, silicon phosphide, titanium, nickel, silicon nitride, silicon dioxide, silicon carbide, n-type doped silicon, and aluminum capped silicon carbide; arranging a heat reflecting structure between the semiconductor structure and the energy-converting structure, the heat reflecting structure comprising a material substantially transparent to microwave radiation and having substantial reflectivity with respect to infrared radiation; and generating microwave radiation with a microwave source to anneal the semiconductor structure.

This written description uses examples to disclose embodiments of the disclosure, include the best mode, and also to enable a person of ordinary skill in the art to make and use various embodiments of the disclosure. The patentable scope of the disclosure may include other examples that occur to those of ordinary skill in the art. One of ordinary skill in the relevant art will recognize that the various embodiments may be practiced without one or more of the specific details, or with other replacement and/or additional methods, materials, or components. Further, persons of ordinary skill in the art will recognize various equivalent combinations and substitutions for various components shown in the figures.

Well-known structures, materials, or operations may not be shown or described in detail to avoid obscuring aspects of various embodiments of the disclosure. Various embodiments shown in the figures are illustrative example representations and are not necessarily drawn to scale. Particular features, structures, materials, or characteristics may be combined in any suitable manner in one or more embodiments. The present disclosure may repeat reference numerals and/or letters in the various examples, and this repetition is for the purpose of simplicity and clarity and does not in itself dictate a relationship between the various embodiments and/or configurations discussed. Various additional layers and/or structures may be included and/or described features may be omitted in other embodiments. Various operations may be described as multiple discrete operations in turn, in a manner that is most helpful in understanding the disclosure. However, the order of description should not be construed as to imply that these operations are necessarily order dependent. In particular, these operations need not be performed in the order of presentation. Operations described herein may be performed in a different order, in series or in parallel, than the described embodiments. Various additional operations may be performed and/or described. Operations may be omitted in additional embodiments.

This written description and the following claims may include terms, such as top, on, over, etc. that are used for descriptive purposes only and are not to be construed as limiting. The embodiments of a device or article described herein can be manufactured, used, or shipped in a number of positions and orientations. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "on" or "over" as used herein (including in the claims) may not necessarily indicate that a first layer/structure "on" or "over" a second layer/structure is directly on or over and in immediate contact with the second layer/structure unless such is specifically stated; there may be one or more third layers/structures between the first layer/structure and the second layer/structure. The term "substrate" used herein (including in the claims) may refer to any construction comprising one or more semiconductive materials, including, but not limited to, bulk semiconductive materials such as a semiconductive wafer (either alone or in assemblies comprising other materials thereon), and semiconductive material layers (either alone or in assemblies comprising other materials). The term "semiconductor structure" used herein (including in the claims) may refer to shallow trench isolation features, poly-silicon gates, lightly doped drain regions, doped wells, contacts, vias, metal lines, or other types of circuit patterns or features to be formed on a semiconductor substrate. In addition, the term "semiconductor structure" used herein (including in the claims) may refer to various semiconductor devices, including transistors, capacitors, diodes, and other electronic devices that obey semiconductor physics and/or quantum mechanics.

What is claimed is:

1. A system comprising:
a radiation source for generating first radiation;
a shell defining an interior cavity, wherein the shell includes an opening through which the first radiation generated by the radiation source passes through;
a semiconductor structure disposed within the interior cavity of the shell;
an energy-converting structure disposed within the interior cavity of the shell, the energy-converting structure configured to convert first radiation into second radiation; and a second radiation reflecting structure disposed within the interior cavity of the shell, wherein the second radiation reflecting structure reflects second radiation generated by the semiconductor structure back towards the semiconductor structure.

2. The system of claim 1, wherein the second radiation reflecting structure is disposed over the semiconductor structure and the energy-converting structure is disposed over the second radiation reflecting structure.

3. The system of claim 2, wherein the energy-converting structure is spaced apart from the second radiation reflecting structure.

4. The system of claim 1, wherein the first radiation includes microwave radiation and the second radiation includes thermal radiation.

5. The system of claim 1, wherein the shell includes only the single opening through which the first radiation generated by the radiation source passes through.

6. The system of claim 1, wherein the second radiation reflecting structure includes a semiconductor wafer.

7. The system of claim 1, wherein the shell is formed of a metal material.

8. A system comprising:
a radiation source for generating first radiation;
an energy-converting structure disposed over a semiconductor structure, the energy-converting structure configured to convert first radiation into second radiation; and
a semiconductor wafer positioned between the semiconductor structure and the energy-converting structure, wherein the semiconductor wafer reflects second radiation generated by the semiconductor structure back towards the semiconductor structure, wherein the semiconductor wafer is spaced apart from the energy-converting structure and the semiconductor structure.

9. The system of claim 8, wherein the semiconductor wafer is positioned a first distance away from the energy-converting structure and a second distance away from the semiconductor wafer, the first distance being the same as the second distance.

10. The system of claim 8, wherein the semiconductor wafer is positioned a first distance away from the energy-converting structure and a second distance away from the semiconductor wafer, the first distance being different than the second distance.

11. The system of claim 8, further comprising another energy-converting structure disposed under the semiconductor structure.

12. The system of claim 11, wherein the another energy-converting structure is spaced apart from the semiconductor structure.

13. The system of claim 8, wherein the radiation source is a microwave radiation source,
wherein the energy-converting structure is configured to convert microwave radiation into thermal radiation, and
wherein the semiconductor wafer reflects thermal radiation generated by the semiconductor structure back towards the semiconductor structure.

14. The system of claim 8, wherein the energy-converting structure includes at least one material selected from the group consisting of boron-doped silicon germanium, silicon phosphide, titanium, nickel, silicon nitride, silicon dioxide, silicon carbide, n-type doped silicon, and aluminum cap silicon carbide.

15. A method comprising:
- providing a first energy-converting structure and a thermal radiation reflecting structure proximate a semiconductor structure;
- adjusting one of the thermal radiation reflecting structure and the semiconductor structure to change a distance between the thermal radiation reflecting structure and the semiconductor structure; and
- providing radiation to the first energy-converting structure while the thermal radiation reflecting structure is between the semiconductor structure and the first energy-converting structure.

16. The method of claim 15, wherein the thermal radiation reflecting structure is spaced apart from the first energy-converting structure during the providing of the radiation to the first energy-converting structure while the thermal radiation reflecting structure is between the semiconductor structure and the first energy-converting structure.

17. The method of claim 15, further comprising epitaxially growing the thermal radiation reflecting structure on the first energy-converting structure.

18. The method of claim 15, further comprising positioning the first energy-converting structure, the thermal radiation reflecting structure and the semiconductor structure into an interior cavity of a shell, and
- wherein the providing of the radiation to the first energy-converting structure includes proving the radiation through an opening in the shell to the first energy-converting structure disposed within the cavity of the shell.

19. The method of claim 15, wherein the providing of the radiation to the first energy-converting structure includes applying radiation to the semiconductor structure to activate a dopant region on the semiconductor structure.

20. The method of claim 15, wherein the thermal radiation reflecting structure includes a silicon wafer.

* * * * *